United States Patent
Kim (10) Patent No.: US 10,923,167 B2
(45) Date of Patent: Feb. 16, 2021

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 132 days.

(21) Appl. No.: 16/400,454

(22) Filed: May 1, 2019

(65) Prior Publication Data

US 2020/0160897 A1    May 21, 2020

(30) Foreign Application Priority Data

Nov. 19, 2018   (KR) .................. 10-2018-0142647

(51) Int. Cl.
*G11C 7/00*   (2006.01)
*G11C 8/06*   (2006.01)
*G11C 8/18*   (2006.01)
*G11C 7/10*   (2006.01)
*G11C 7/12*   (2006.01)

(52) U.S. Cl.
CPC .............. *G11C 8/06* (2013.01); *G11C 7/1051* (2013.01); *G11C 7/12* (2013.01); *G11C 8/18* (2013.01)

(58) Field of Classification Search
CPC ............ G11C 8/06; G11C 8/18; G11C 7/1051
USPC ......................................................... 365/194
See application file for complete search history.

(56) References Cited

U.S. PATENT DOCUMENTS

| | | | |
|---|---|---|---|
| 6,061,294 A * | 5/2000 | Koshikawa | G11C 7/1072 365/233.11 |
| 6,456,563 B1 * | 9/2002 | Kajimoto | G11C 7/1051 365/189.04 |
| 2004/0047230 A1 * | 3/2004 | Mizuhashi | G11C 7/1072 365/233.1 |
| 2007/0147148 A1 * | 6/2007 | An | G11C 11/4087 365/201 |
| 2015/0310904 A1 | 10/2015 | Kim et al. | |

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

A semiconductor device includes an address latch circuit and a column address generation circuit. The address latch circuit latches an address based on an input control signal generated according to a column control pulse and outputs the latched address as a pre-column address based on an output control signal generated according to an internal column control pulse. The column address generation circuit generates a column address from the pre-column address based on a delayed column control pulse and a delayed internal column control pulse.

20 Claims, 9 Drawing Sheets

SEMICONDUCTOR DEVICES

CROSS-REFERENCE TO RELATED APPLICATIONS

The present application claims priority under 35 U.S.C 119(a) to Korean Application No. 10-2018-0142647, filed on Nov. 19, 2018, which is incorporated herein by reference in its entirety.

BACKGROUND

1. Technical Field

Embodiments of the present disclosure relate to semiconductor devices performing a column operation.

2. Related Art

In general, semiconductor devices, such as dynamic random access memory (DRAM) devices, may include a plurality of bank groups with cell arrays which are selected by addresses. Each of the bank groups may include a plurality of banks. The semiconductor device may select one of the plurality of bank groups and may perform a column operation for outputting data stored in a bank included in the selected bank group through input/output (I/O) lines.

SUMMARY

According to an embodiment, a semiconductor device includes an address latch circuit and a column address generation circuit. The address latch circuit latches an address based on an input control signal generated according to a column control pulse and outputs the latched address as a pre-column address based on an output control signal generated according to an internal column control pulse. The column address generation circuit generates a column address from the pre-column address based on a delayed column control pulse and a delayed internal column control pulse. The delayed column control pulse is generated by delaying the column control pulse, and the delayed internal column control pulse is generated by delaying the internal column control pulse.

According to another embodiment, a semiconductor device includes a column delay circuit configured to delay a column control pulse by a first column delay period to generate a delayed column control pulse. The semiconductor device also includes an internal column delay circuit configured to delay an internal column control pulse by a second column delay period to generate a delayed internal column control pulse. The semiconductor device further includes a column address generation circuit configured to generate a column address from a pre-column address based on the delayed column control pulse and the delayed internal column control pulse. The pre-column address is generated by latching an address based on the column control pulse and the delayed column control pulse.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Semiconductor devices including a plurality of banks may provide various bank modes, such as a bank group mode, an 8-bank mode, and a 16-bank mode. The plurality of banks may constitute a bank group. For example, four banks may constitute one bank group. In the bank group mode, a column operation for one bank included in the bank group may be performed by one command. In the 8-bank mode, column operations for two banks respectively included in two different bank groups may be sequentially performed by one command. In the 16-bank mode, column operations for four banks respectively included in four different bank groups may be sequentially performed by one command. In the bank group mode, column operations may be separately performed according to a burst length. For example, a column operation for 16-bit data may be performed at one time if the burst length is set to be '16' in the bank group mode. However, if the burst length is set to be '32' in the bank group mode, a first column operation for 16-bit data may be firstly performed and a second column operation for the remaining 16-bit data may be performed after a bubble period elapses from a time when the first column operation terminates. The bubble period may be set as a time period during which a column operation for 16-bit data is performed. During the bubble period, a column operation for another bank may also be performed. In such a case, a plurality of column operations for a plurality of banks may be sequentially performed using the bubble period.

Figure 1:
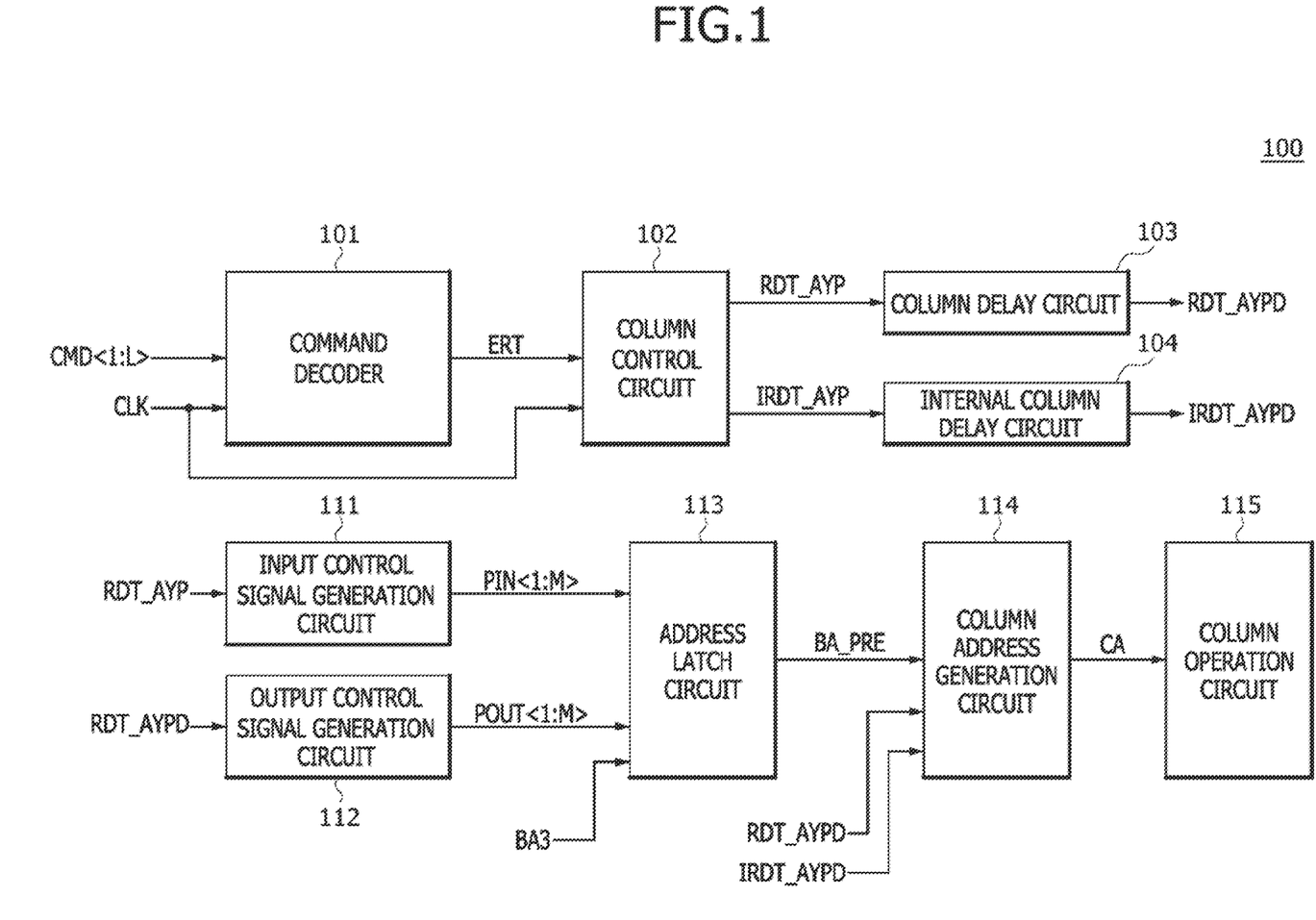
FIG. 1 shows a block diagram illustrating a configuration of a semiconductor device, according to an embodiment of the present disclosure.

As illustrated in FIG. 1, a semiconductor device 100, according to an embodiment, may include a command decoder 101, a column control circuit 102, a column delay circuit 103, an internal column delay circuit 104, an input control signal generation circuit 111, an output control signal generation circuit 112, an address latch circuit 113, a column address generation circuit 114, and a column operation circuit 115.

The command decoder 101 may decode a command CMD<1:L> based on a clock signal CLK to generate a read signal ERT. The read signal ERT may be generated to perform a read operation. The read signal ERT may be generated in synchronization with a rising edge (corresponding to a time when a level transition from a logic "low" level to a logic "high" level occurs) or a falling edge (corresponding to a time when a level transition from a logic "high" level to a logic "low" level occurs) of the clock signal CLK according to embodiment. A logic level combination of the command CMD<1:L> for generating the read signal ERT may be set differently for different embodiments. The number "L" of bits included in the command CMD<1:L> may be set differently for different embodiments (here "L" denotes a natural number).

The column control circuit 102 may generate a column control pulse RDT_AYP and an internal column control pulse IRDT_AYP from the read signal ERT, based on the clock signal CLK. The column control circuit 102 may generate the column control pulse RDT_AYP when the read signal ERT is generated. The column control circuit 102 may generate the column control pulse RDT_AYP in synchronization with a first rising edge or a first falling edge of the clock signal CLK generated after the read signal ERT is generated, according to embodiment. The column control circuit 102 may generate the internal column control pulse IRDT_AYP at a time when a column operation period elapses from a time when the column control pulse RDT_AYP is generated. The column operation period may be set as a period used to perform a column operation of a bank (711 of FIG. 8) included in a first bank group (71 of FIG. 8) when the column operation of the bank (711 of FIG. 8) included in the first bank group (71 of FIG. 8) and a column operation of a bank (721 of FIG. 8) included in a second bank group (72 of FIG. 8) are sequentially performed in the 8-bank mode.

The column delay circuit 103 may delay the column control pulse RDT_AYP by a first column delay period to generate a delayed column control pulse RDT_AYPD. The first column delay period may be set as a period from a time when the column control pulse RDT_AYP is created until a time when the column operation of the bank (711 of FIG. 8) included in the first bank group (71 of FIG. 8) starts when the column operation of the bank (711 of FIG. 8) included in the first bank group (71 of FIG. 8) and the column operation of the bank (721 of FIG. 8) included in the second bank group (72 of FIG. 8) are sequentially performed in the 8-bank mode.

The internal column delay circuit 104 may delay the internal column control pulse IRDT_AYP by a second column delay period to generate a delayed internal column control pulse IRDT_AYPD. The second column delay period may be set as a period from a time when the internal column control pulse IRDT_AYP is created until a time when the column operation of the bank (721 of FIG. 8) included in the second bank group (72 of FIG. 8) starts when the column operation of the bank (711 of FIG. 8) included in the first bank group (71 of FIG. 8) and the column operation of the bank (721 of FIG. 8) included in the second bank group (72 of FIG. 8) are sequentially performed in the 8-bank mode.

The input control signal generation circuit 111 may generate first to $M^{th}$ input control signals PIN<1:M> based on the column control pulse RDT_AYP. The input control signal generation circuit 111 may sequentially and iteratively generate the first to $M^{th}$ input control signals PIN<1:M> when the column control pulses RDT_AYP are successively created. For example, the input control signal generation circuit 111 may generate the first input control signal PIN<1> when the column control pulse RDT_AYP is firstly created, may generate the $M^{th}$ input control signal PIN<M> when the column control pulse RDT_AYP is Mthly created, and may generate the first input control signal PIN<1> when the column control pulse RDT_AYP is (M+1)thly created.

The output control signal generation circuit 112 may generate first to $M^{th}$ output control signals POUT<1:M> based on the delayed column control pulse RDT_AYPD. The output control signal generation circuit 112 may sequentially and iteratively generate the first to $M^{th}$ output control signals POUT<1:M> when the delayed column control pulses RDT_AYPD are successively created. For example, the output control signal generation circuit 112 may generate the first output control signal POUT<1> when the delayed column control pulse RDT_AYPD is firstly created, may generate the $M^{th}$ output control signal POUT<M> when the delayed column control pulse RDT_AYPD is Mthly created, and may generate the first output control signal POUT<1> when the delayed column control pulse RDT_AYPD is (M+1)thly created.

The address latch circuit 113 may generate a pre-column address BA_PRE from an address BA3 based on the first to $M^{th}$ input control signals PIN<1:M> and the first to $M^{th}$ output control signals POUT<1:M>. The address latch circuit 113 may be synchronized with the first input control signal PIN<1> to latch the address BA3 and may be synchronized with the first output control signal POUT<1> to output the latched signal of the address BA3 as the pre-column address BA_PRE. The address latch circuit 113 may be synchronized with the second input control signal PIN<2> to latch the address BA3 and may be synchronized with the second output control signal POUT<2> to output the latched signal of the address BA3 as the pre-column address BA_PRE. The address latch circuit 113 may be synchronized with the $M^{th}$ input control signal PIN<M> to latch the address BA3 and may be synchronized with the $M^{th}$ output control signal POUT<M> to output the latched signal of the address BA3 as the pre-column address BA_PRE.

The column address generation circuit 114 may generate a column address CA from the pre-column address BA_PRE based on the delayed column control pulse RDT_AYPD and the delayed internal column control pulse IRDT_AYPD. The column address generation circuit 114 may latch and buffer the pre-column address BA_PRE to output the latched and buffered signal of the pre-column address BA_PRE as the column address CA when the delayed column control pulse RDT_AYPD or the delayed internal column control pulse IRDT_AYPD is created. The column address generation circuit 114 may invert a level of the column address CA to output the inverted signal of the column address CA when the delayed internal column control pulse IRDT_AYPD is created.

The column operation circuit 115 may perform the column operations of the banks (711 and 712 of FIG. 8) in a core circuit (7 of FIG. 8), which are selected by the column address CA. The column operation circuit 115 may include a decoder (not shown) for decoding the column address CA and a control circuit (not shown) for controlling a data output operation of cell arrays included in the banks (711 and 712 of FIG. 8). The column operation circuit 115 may be realized using a general circuit for controlling a read operation and a write operation. Thus, a detailed description for a configuration and an operation of the column control circuit 115 is omitted here.

Figure 2:
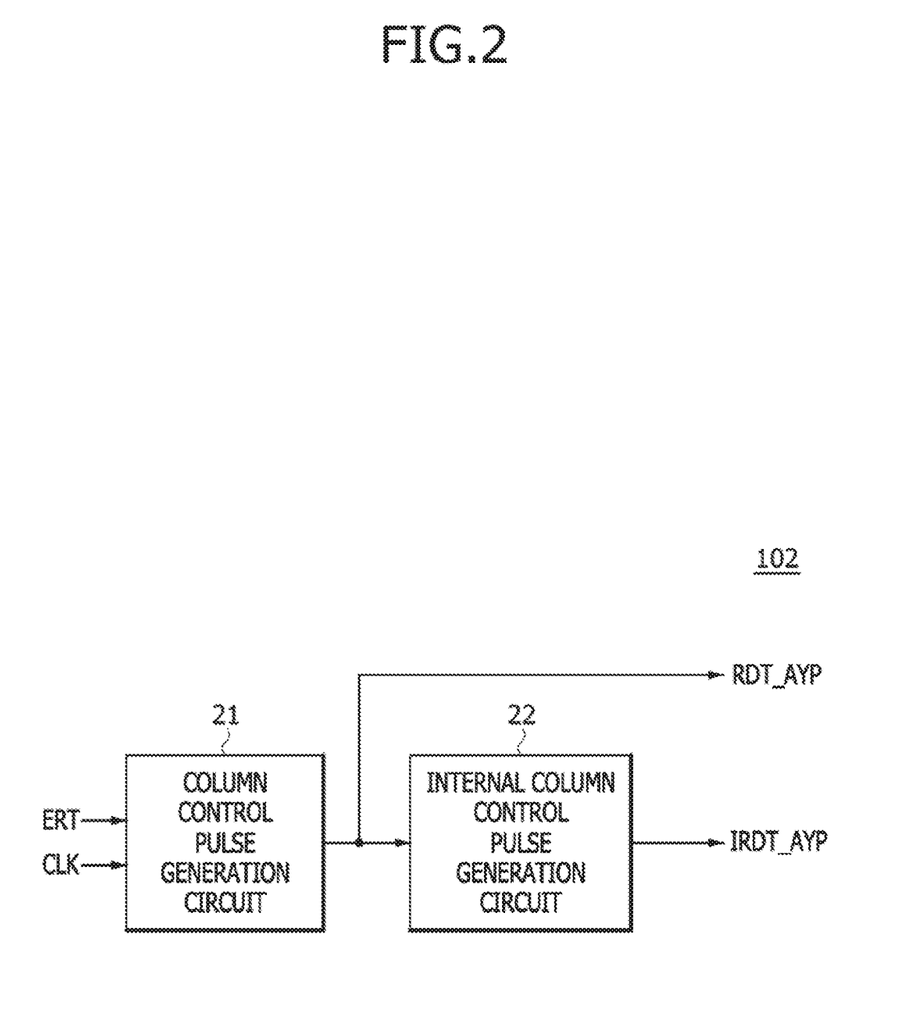
FIG. 2 shows a block diagram illustrating an example of a column control circuit included in the semiconductor device of FIG. 1.

Referring to FIG. 2, the column control circuit 102 may include a column control pulse generation circuit 21 and an internal column control pulse generation circuit 22. The column control pulse generation circuit 21 may generate the column control pulse RDT_AYP from the read signal ERT based on the clock signal CLK. The column control pulse generation circuit 21 may generate the column control pulse RDT_AYP in synchronization with a first rising edge or a first falling edge of the clock signal CLK generated after the read signal ERT is generated, according to embodiment. The internal column control pulse generation circuit 22 may generate the internal column control pulse IRDT_AYP at a time when the column operation period elapses from a time when the column control pulse RDT_AYP is generated.

Figure 3:
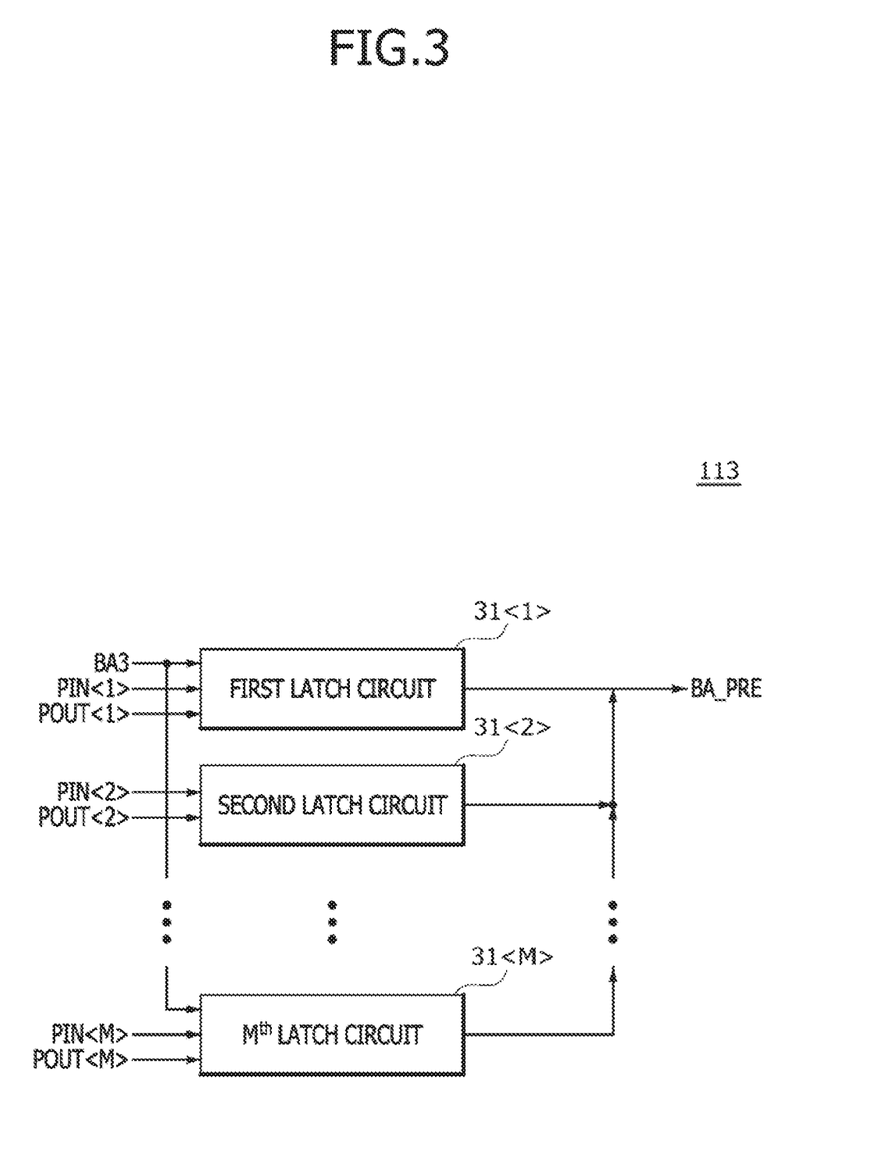
FIG. 3 shows a block diagram illustrating an example of an address latch circuit included in the semiconductor device of FIG. 1.

Referring to FIG. 3, the address latch circuit 113 may include first to $M^{th}$ latch circuits 31<1:M>. The first latch circuit 31<1> may be synchronized with the first input control signal PIN<1> to latch the address BA3 and may be synchronized with the first output control signal POUT<1> to output the latched signal of the address BA3 as the pre-column address BA_PRE. The second latch circuit 31<2> may be synchronized with the second input control signal PIN<2> to latch the address BA3 and may be synchronized with the second output control signal POUT<2> to output the latched signal of the address BA3 as the pre-column address BA_PRE. The $M^{th}$ latch circuit 31<M> may be synchronized with the $M^{th}$ input control signal PIN<M> to latch the address BA3 and may be synchronized with the $M^{th}$ output control signal POUT<M> to output the latched signal of the address BA3 as the pre-column address BA_PRE.

Figure 4:
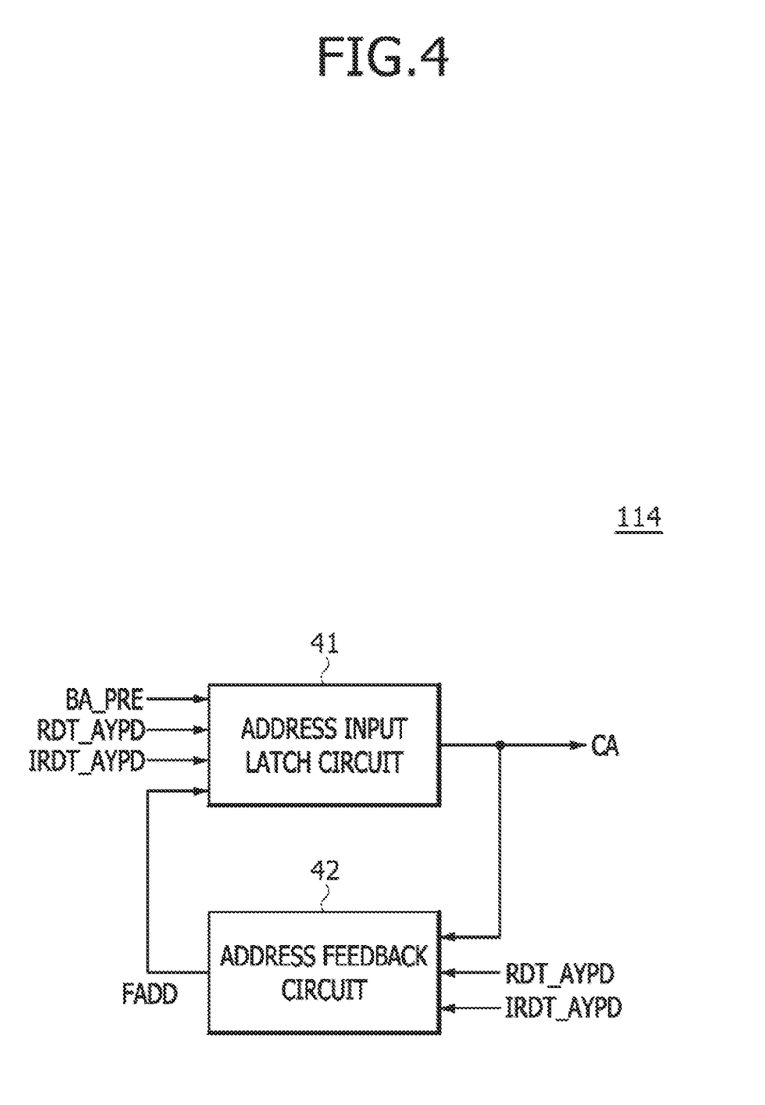
FIG. 4 shows a block diagram illustrating an example of a column address generation circuit included in the semiconductor device of FIG. 1.

Referring to FIG. 4, the column address generation circuit 114 may include an address input latch circuit 41 and an address feedback circuit 42. The address input latch circuit 41 may generate the column address CA from the pre-column address BA_PRE based on the delayed column control pulse RDT_AYPD and the delayed internal column control pulse IRDT_AYPD. The address input latch circuit 41 may latch the pre-column address BA_PRE and may buffer (or inversely buffer according to some embodiments) a feedback address FADD or the latched signal of the pre-column address BA_PRE to output the buffered signal of the feedback address FADD or the buffered signal of the pre-column address BA_PRE as the column address CA, if the delayed column control pulse RDT_AYPD or the delayed internal column control pulse IRDT_AYPD is generated. The address feedback circuit 42 may generate the feedback address FADD from the column address CA based on the delayed column control pulse RDT_AYPD and the delayed internal column control pulse IRDT_AYPD. The address feedback circuit 42 may latch the column address CA if the delayed column control pulse RDT_AYPD is generated. The address feedback circuit 42 may invert a logic level of the column address CA to output the inverted column address CA as the feedback address FADD if the delayed internal column control pulse IRDT_AYPD is generated.

Figure 5:
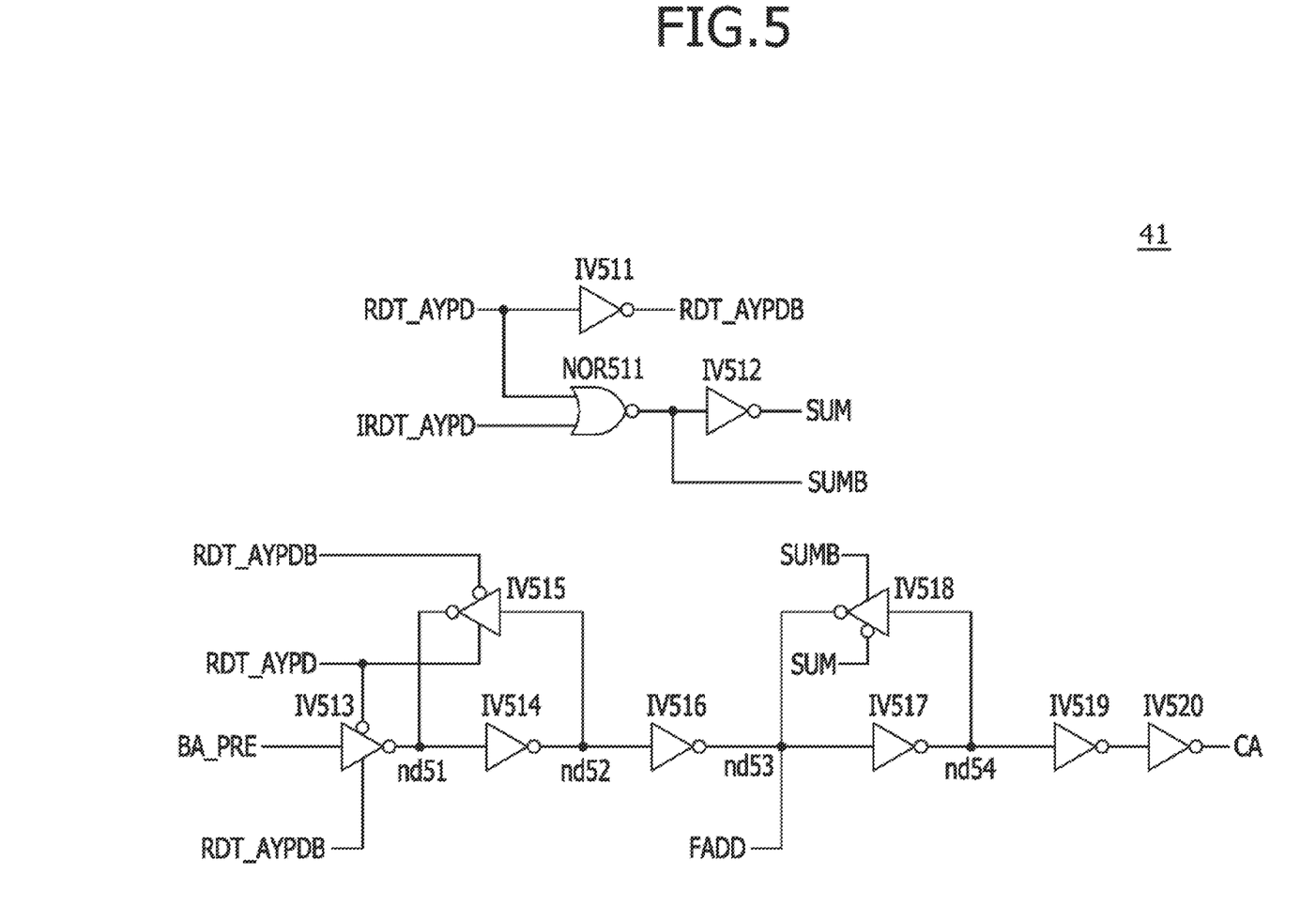
FIG. 5 shows a circuit diagram illustrating an example of an address input latch circuit included in the column address generation circuit of FIG. 4.

Referring to FIG. 5, the address input latch circuit 41 may include inverters IV511, IV512, IV513, IV514, IV515, IV516, IV517, IV518, IV519, and IV520 and a NOR gate NOR511. The inverter IV511 may inversely buffer the delayed column control pulse RDT_AYPD to generate an inverted delay column control pulse RDT_AYPDB. If the delayed column control pulse RDT_AYPD is generated to have a logic "high" level, then the inverted delay column control pulse RDT_AYPDB may be set to have a logic "low" level. The NOR gate NOR511 may perform a logical NOR operation of the delayed column control pulse RDT_AYPD and the delayed internal column control pulse IRDT_AYPD to generate an inverted synthesis pulse SUMB. If the delayed column control pulse RDT_AYPD or the delayed internal column control pulse IRDT_AYPD is generated to have a logic "high" level, the inverted synthesis pulse SUMB may be set to have a logic "low" level. The inverter IV512 may inversely buffer the inverted synthesis pulse SUMB to generate a synthesis pulse SUM. If the delayed column control pulse RDT_AYPD or the delayed internal column control pulse IRDT_AYPD is generated to have a logic "high" level, the synthesis pulse SUM may be generated to have a logic "high" level.

The inverter IV513 may inversely buffer the pre-column address BA_PRE to output the inversely buffered signal of the pre-column address BA_PRE to a node nd51 while the delayed column control pulse RDT_AYPD has a logic "low" level. The inverter IV514 may inversely buffer a signal of the node nd51 to output the inversely buffered signal of the signal of the node nd51 to a node nd52. The inverter IV515 may inversely buffer a signal of the node nd52 to output the inversely buffered signal of the signal of the node nd52 to the node nd51 while the delayed column control pulse RDT_AYPD has a logic "high" level. The inverter IV516 may inversely buffer a signal of the node nd52 to output the inversely buffered signal of the signal of the node nd52 to a node nd53. The feedback address FADD may be inputted to the node nd53. The inverter IV517 may inversely buffer a signal of the node nd53 to output the inversely buffered signal of the signal of the node nd53 to a node nd54. The inverter IV518 may inversely buffer a signal of the node nd54 to output the inversely buffered signal of the signal of the node nd54 to a node nd53 while the synthesis pulse SUM has a logic "low" level. The inverters IV519 and IV520 may buffer the signal of the node nd54 to output the buffered signal of the signal of the node nd54 as the column address CA.

The address input latch circuit 41 may generate the column address CA from the pre-column address BA_PRE or the feedback address FADD based on the delayed column control pulse RDT_AYPD and the delayed internal column control pulse IRDT_AYPD. The address input latch circuit 41 may latch the pre-column address BA_PRE and may buffer the latched signal of the pre-column address BA_PRE or inversely buffer the feedback address FADD to output the buffered signal of the pre-column address BA_PRE or the inversely buffered signal of the feedback address FADD as the column address CA, if the delayed column control pulse RDT_AYPD or the delayed internal column control pulse IRDT_AYPD is generated.

Figure 6:
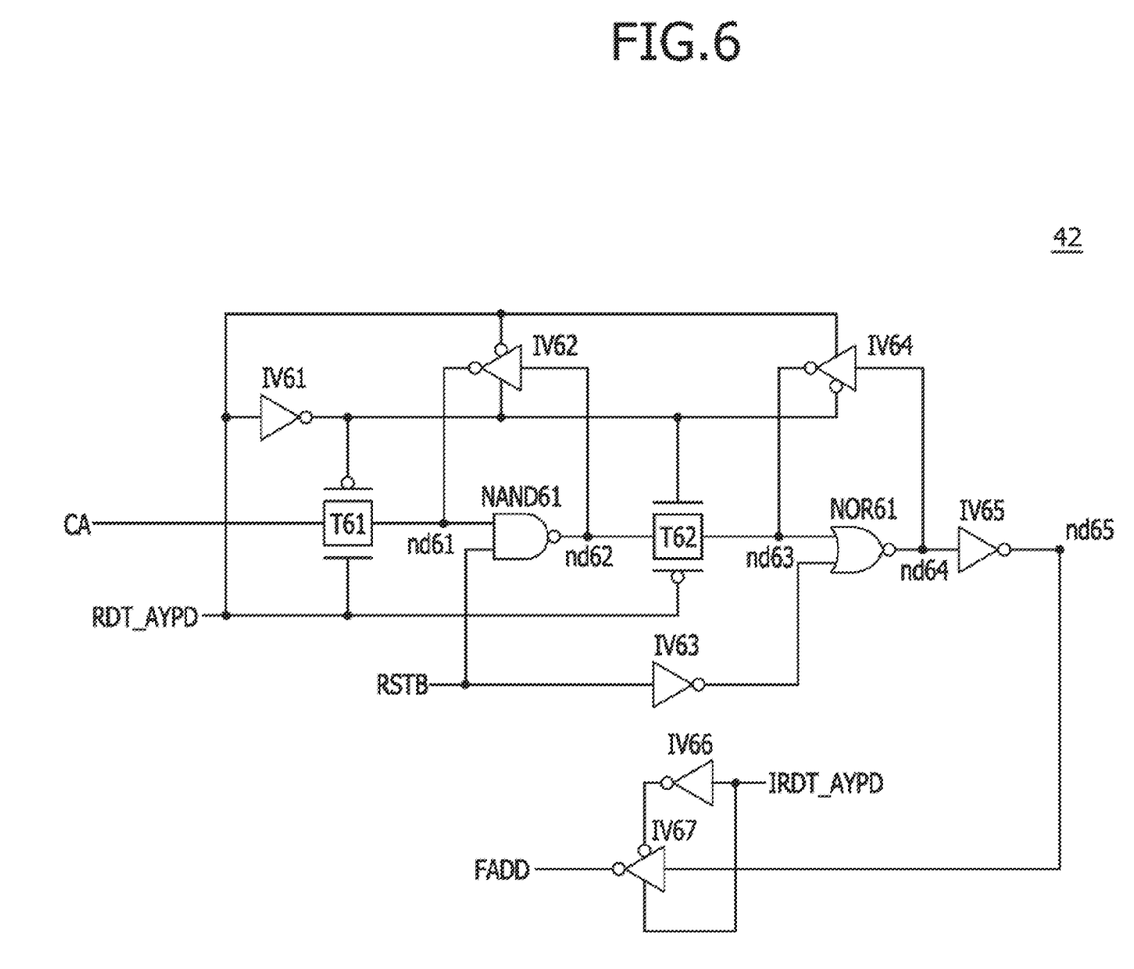
FIG. 6 shows a circuit diagram illustrating an example of an address feedback circuit included in the column address generation circuit of FIG. 4.

Referring to FIG. 6, the address feedback circuit 42 may include inverters IV61, IV62, IV63, IV64, IV65, IV66, and IV67, transfer gates T61 and T62, a NAND gate NAND61, and a NOR gate NOR61. The inverter IV61 may inversely buffer the delayed column control pulse RDT_AYPD to output the inversely buffered signal of the delayed column control pulse RDT_AYPD. The transfer gate T61 may output the column address CA to a node nd61 while the delayed column control pulse RDT_AYPD is generated to have a logic "high" level. The NAND gate NAND61 may perform a logical NAND operation of a signal of the node nd61 and a reset signal RSTB. The reset signal RSTB may be generated to have a logic "low" level to perform a reset operation. The NAND gate NAND61 may output a signal having a logic "high" level through a node nd62 if the reset signal RSTB having a logic "low" level is inputted to an input terminal of the NAND gate NAND61 to perform the reset operation. The transfer gate T62 may output a signal of the node nd62 to a node nd63 while the delayed column control pulse RDT_AYPD is generated to have a logic "low" level. The inverter IV63 may inversely buffer the reset signal RSTB to output the inversely buffered signal of the reset signal RSTB. The NOR gate NOR61 may perform a logical NOR operation of a signal of the node nd63 and an output signal of the inverter IV63. The inverter IV64 may inversely buffer a signal of the node nd64 to output the inversely buffered signal of the signal of the node nd64 to the node nd63 while the delayed column control pulse RDT_AYPD is generated to have a logic "high" level. The inverter IV65 may inversely buffer a signal of the node nd64 to output the inversely buffered signal of the signal of the node nd64 to the node nd65. The inverter IV66 may inversely buffer the delayed internal column control pulse IRDT_AYPD to output the inversely buffered signal of the delayed internal column control pulse IRD_AYPD. The inverter IV67 may inversely buffer a signal of the node nd65 to output the inversely buffered signal of the signal of the node nd65 as the feedback address FADD if the delayed internal column control pulse IRDT_AYPD is generated to have a logic "high" level.

The address feedback circuit 42 may generate the feedback address FADD from the column address CA based on the delayed column control pulse RDT_AYPD and the delayed internal column control pulse IRDT_AYPD. The address feedback circuit 42 may latch the column address CA if the delayed column control pulse RDT_AYPD is generated. The address feedback circuit 42 may invert a logic level of the column address CA to output the inverted signal of the column address CA as the feedback address FADD if the delayed internal column control pulse IRDT_AYPD is generated.

Figure 7:
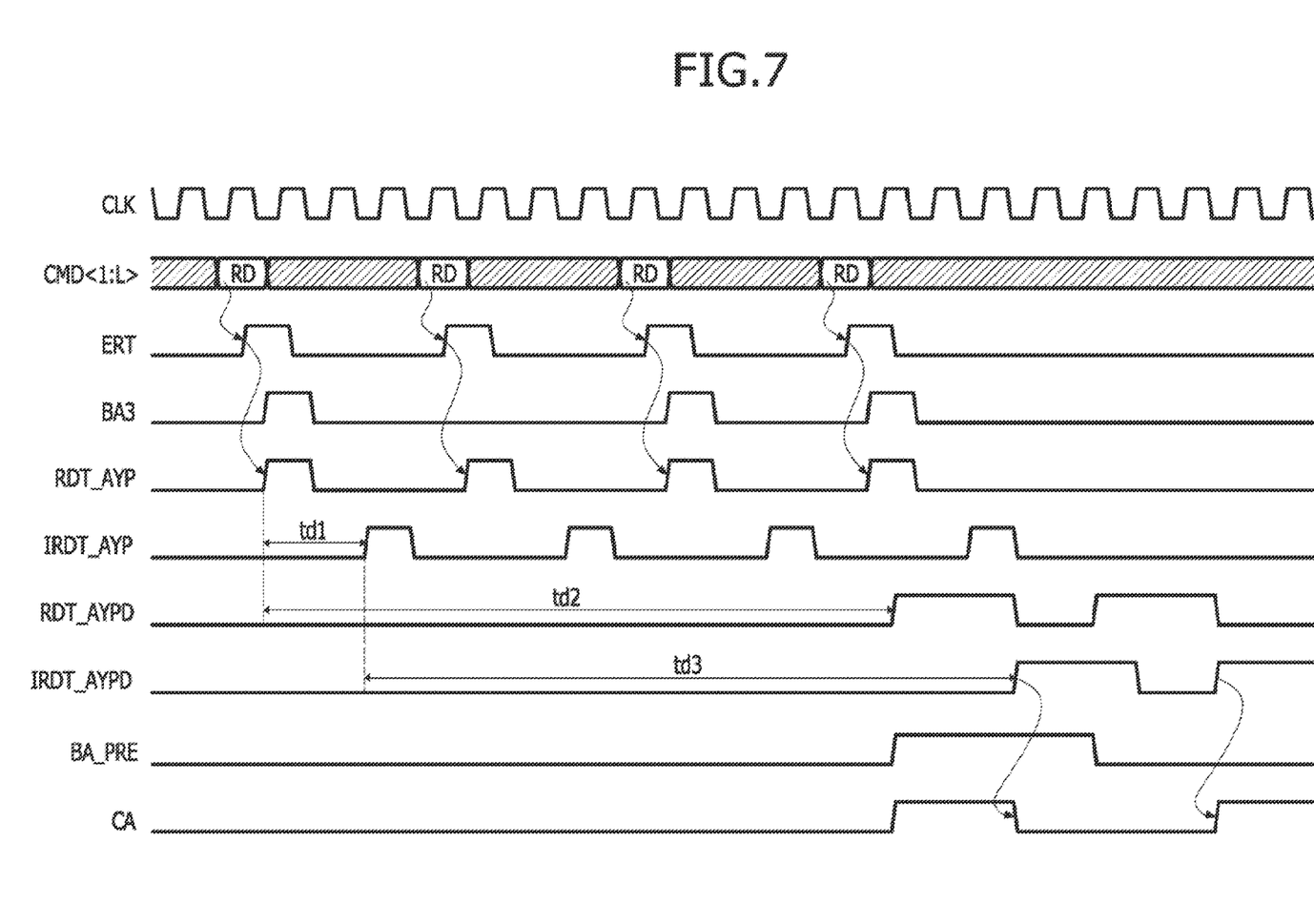
FIG. 7 shows a timing diagram illustrating an operation of the semiconductor device shown in FIG. 1.

An operation of the semiconductor device 100 having the aforementioned configuration is described below with reference to FIG. 7.

If read commands RD for the read operations are sequentially inputted to the command decoder 101 through the command CMD<1:L> based on the clock signal CLK, the read signal ERT may be generated in synchronization with the read commands RD. The column control pulse RDT_AYP may be generated in synchronization with a first falling edge of the clock signal CLK generated after generation of the read signal ERT. The address BA3 having a logic "high" level may be inputted in synchronization with a time when the column control pulse RDT_AYP is firstly generated, and the address BA3 having a logic "low" level may be inputted in synchronization with a time when the column control pulse RDT_AYP is secondly generated. In addition, the address BA3 having a logic "high" level may be inputted in synchronization with a time when the column control pulse RDT_AYP is thirdly generated, and the address BA3 having a logic "high" level may be inputted in synchronization with a time when the column control pulse RDT_AYP is fourthly generated.

The internal column control pulse IRDT_AYP may be generated at a time when a column operation period td1 elapses from time when the column control pulse RDT_AYP is generated. The column operation period td1 may be set as a period that is required to perform the column operation of the bank (711 of FIG. 8) included in the first bank group (71 of FIG. 8) when the column operation of the bank (711 of FIG. 8) included in the first bank group (71 of FIG. 8) and the column operation of the bank (721 of FIG. 8) included in the second bank group (72 of FIG. 8) are sequentially performed in the 8-bank mode.

The delayed column control pulse RDT_AYPD may be generated at a time when a first column delay period td2 elapses from a time when the column control pulse RDT_AYP is generated. The first column delay period td2 may be set as a period from a time when the column control pulse RDT_AYP is created until a time when the column operation of the bank (711 of FIG. 8) included in the first bank group (71 of FIG. 8) starts when the column operation of the bank (711 of FIG. 8) included in the first bank group (71 of FIG. 8) and the column operation of the bank (721 of FIG. 8) included in the second bank group (72 of FIG. 8) are sequentially performed in the 8-bank mode.

The delayed internal column control pulse IRDT_AYPD may be generated at a time when a second column delay period td3 elapses from a time when the internal column control pulse IRDT_AYP is generated. The second column delay period td3 may be set as a period from a time when the internal column control pulse IRDT_AYP is created until a time when the column operation of the bank (721 of FIG. 8) included in the second bank group (72 of FIG. 8) starts when the column operation of the bank (711 of FIG. 8) included in the first bank group (71 of FIG. 8) and the column operation of the bank (721 of FIG. 8) included in the second bank group (72 of FIG. 8) are sequentially performed in the 8-bank mode.

The address BA3 inputted with a logic "high" level may be latched in synchronization with a time when the column control pulse RDT_AYP is firstly generated, and the latched signal of the address BA3 having a logic "high" level may be outputted as the pre-column address BA_PRE in synchronization with a time when the delayed column control pulse RDT_AYPD is firstly generated. The address BA3 inputted with a logic "low" level may be latched in synchronization with a time when the column control pulse RDT_AYP is secondly generated, and the latched signal of the address BA3 having a logic "low" level may be outputted as the pre-column address BA_PRE in synchronization with a time when the delayed column control pulse RDT_AYPD is secondly generated.

The pre-column address BA_PRE having a logic "high" level may be buffered and outputted as the column address CA in synchronization with a time when the delayed column control pulse RDT_AYPD is firstly generated. The pre-column address BA_PRE having a logic "high" level may be inversely buffered and outputted as the column address CA in synchronization with a time when the delayed internal column control pulse IRDT_AYPD is firstly generated. The pre-column address BA_PRE having a logic "low" level may be buffered and outputted as the column address CA in synchronization with a time when the delayed column control pulse RDT_AYPD is secondly generated. The pre-column address BA_PRE having a logic "low" level may be inversely buffered and outputted as the column address CA in synchronization with a time when the delayed internal column control pulse IRDT_AYPD is secondly generated.

If the first read command RD is generated in the 8-bank mode for which the column operation of the bank (711 of FIG. 8) included in the first bank group (71 of FIG. 8) and the column operation of the bank (721 of FIG. 8) included in the second bank group (72 of FIG. 8) are sequentially performed, then the column operation of the bank (721 of FIG. 8) included in the second bank group (72 of FIG. 8) may be performed by the column address CA having a logic "low" level after the column operation of the bank (711 of FIG. 8) included in the first bank group (71 of FIG. 8) is performed by the column address CA having a logic "high" level.

Figure 8:
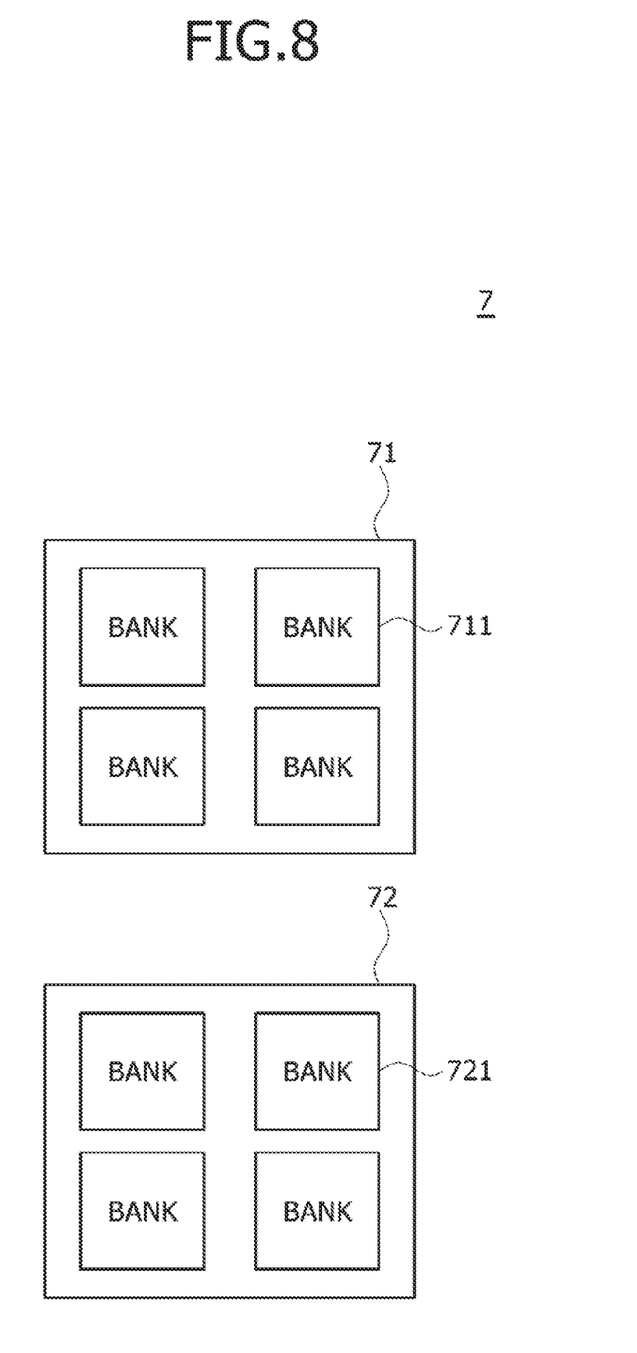
FIG. 8 shows a block diagram illustrating an example of a core circuit employed in a semiconductor device, according to an embodiment.

If the second read command RD is generated in the 8-bank mode for which the column operation of the bank (711 of FIG. 8) included in the first bank group (71 of FIG. 8) and the column operation of the bank (721 of FIG. 8)

included in the second bank group (72 of FIG. 8) are sequentially performed, then the column operation of the bank (711 of FIG. 8) included in the first bank group (71 of FIG. 8) may be performed by the column address CA having a logic "high" level after the column operation of the bank (721 of FIG. 8) included in the second bank group (72 of FIG. 8) is performed by the column address CA having a logic "low" level with the first read command RD.

If the read operation is performed in the 8-bank mode, then a logic level of the column address CA may be determined by the delayed column control pulse RDT_AYPD and the delayed internal column control pulse IRDT_AYPD. In general circuits, a pulse width of the delayed column control pulse RDT_AYPD and the delayed internal column control pulse IRDT_AYPD may become more extended as compared with a pulse width of the column control pulse RDT_AYP and the internal column control pulse IRDT_AYP due to the degradation of characteristics of MOS transistors used in delay circuits according to a bias-temperature instability (BTS) phenomenon. In the present embodiment, because the delayed column control pulse RDT_AYPD and the delayed internal column control pulse IRDT_AYPD are separately generated by the column delay circuit 103 and the internal column delay circuit 104, it may be possible to effectively suppress the increase of the pulse width of the delayed column control pulse RDT_AYPD and the delayed internal column control pulse IRDT_AYPD. Thus, a logic level of the column address CA may be controlled with a sufficient margin by the delayed column control pulse RDT_AYPD and the delayed internal column control pulse IRDT_AYPD, thereby stably performing the column operation in the 8-bank mode.

As illustrated in FIG. 8, the core circuit 7 may include the first bank group 71 and the second bank group 72. Each of the first bank group 71 and the second bank group 72 may include four banks. If the core circuit 7 operates in the 8-bank mode, then the core circuit 7 may sequentially perform the column operation of any one bank (e.g., the bank 711), which is selected by the column address CA from among the banks included in the first bank group 71, and the column operation of any one bank (e.g., the bank 721), which is selected by the column address CA from among the banks included in the second bank group 72. The bank selected by the column address CA from among the banks included in the first bank group 71 and the bank selected by the column address CA from among the banks included in the second bank group 72 may be different for different embodiments.

Figure 9:
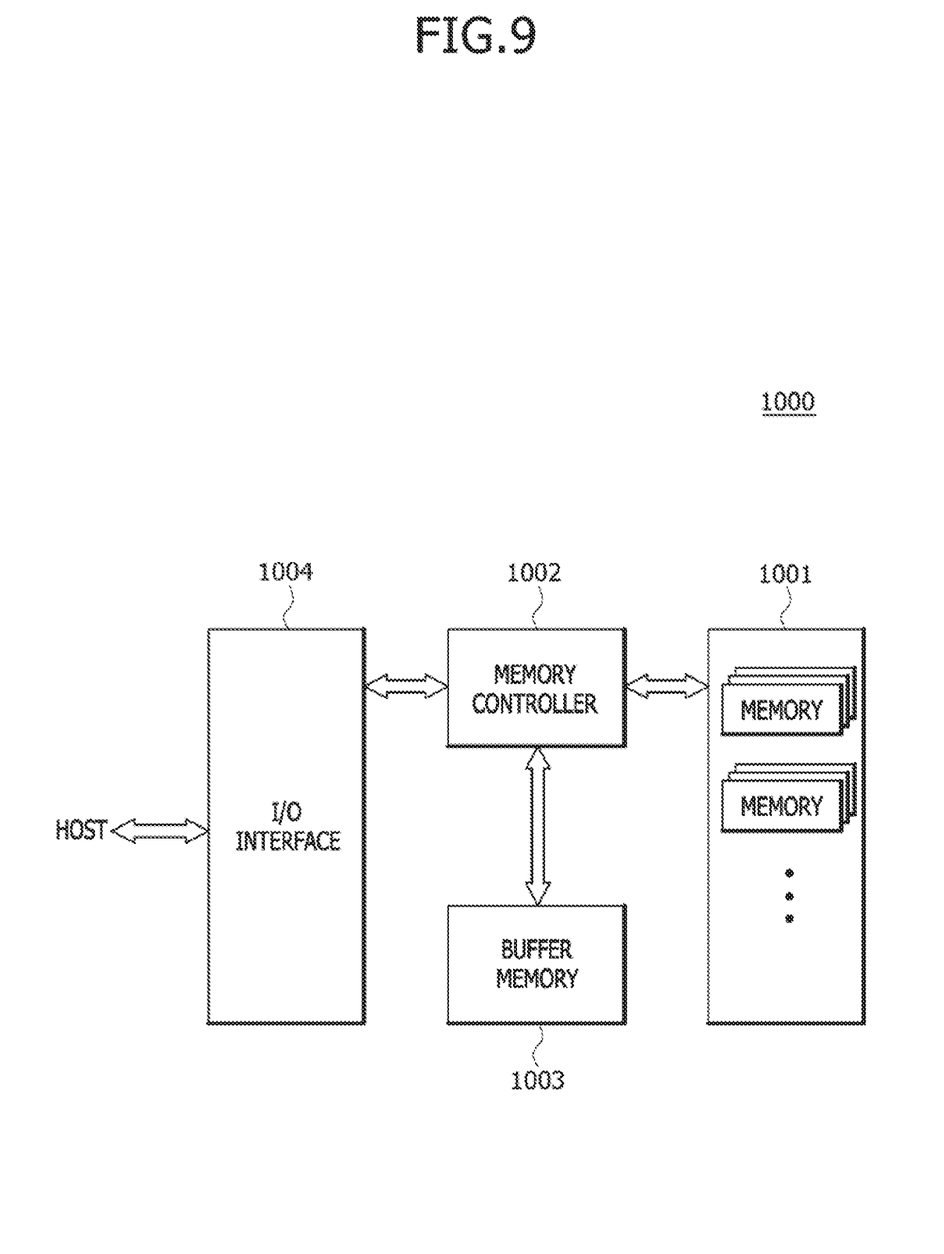
FIG. 9 shows a block diagram illustrating a configuration of an electronic system employing the semiconductor device illustrated in FIG. 1.

The semiconductor device 100 described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 100 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 and another controller for controlling the buffer memory 1003 including volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM). The buffer memory 1003 may include the semiconductor device 100 illustrated in FIG. 1.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a mufti-media card (MMC), an embedded mufti-media card (eMMC), a compact flash (CF) card, or the like.

What is claimed is:

1. A semiconductor device comprising:
   an address latch circuit configured to latch an address based on an input control signal generated according to a column control pulse and configured to output the latched address as a pre-column address based on an output control signal generated according to an internal column control pulse; and
   a column address generation circuit configured to generate a column address from the pre-column address based on a delayed column control pulse generated by delaying the column control pulse and a delayed internal column control pulse generated by delaying the internal column control pulse.

2. The semiconductor device of claim 1, wherein in a mode for which a column operation of a first bank and a column operation of a second bank are sequentially performed, a logic level combination of the column address changes from a first logic level combination for accessing the first bank into a second logic level combination for accessing the second bank.

3. The semiconductor device of claim 1, wherein the column control pulse is generated when a read operation is performed, and wherein the internal column control pulse is generated by delaying the column control pulse by a column operation period.

4. The semiconductor device of claim 3, wherein the column operation period is set as a period in which a column operation of a first bank is performed in a mode for which the column operation of the first bank and a column operation of a second bank are sequentially performed.

5. The semiconductor device of claim 1, further comprising:
a column delay circuit configured to delay the column control pulse by a first column delay period to generate the delayed column control pulse; and
an internal column delay circuit configured to delay the internal column control pulse by a second column delay period to generate the delayed internal column control pulse.

6. The semiconductor device of claim 5, wherein in a mode for which a column operation of a first bank and a column operation of a second bank are sequentially performed, the first column delay period is set as a period from a time when the column control pulse is created until a time when the column operation of the first bank starts.

7. The semiconductor device of claim 5, wherein in a mode for which a column operation of a first bank and a column operation of a second bank are sequentially performed, the second column delay period is set as a period from a time when the internal column control pulse is created until a time when the column operation of the second bank starts.

8. The semiconductor device of claim 1,
wherein the input control signal comprises a first input control signal and a second input control signal;
wherein the output control signal comprises a first output control signal and a second output control signal; and
wherein the address latch circuit comprises:
a first latch circuit configured to latch the address based on the first input control signal and configured to output the latched address as the pre-column address based on the first output control signal; and
a second latch circuit configured to latch the address based on the second input control signal and configured to output the latched address as the pre-column address based on the second output control signal.

9. The semiconductor device of claim 1, wherein the column address generation circuit comprises an address input latch circuit configured to generate the column address from the pre-column address or a feedback address based on the delayed column control pulse and the delayed internal column control pulse.

10. The semiconductor device of claim 9, wherein the address input latch circuit buffers the pre-column address or the feedback address to generate the column address when the delayed column control pulse or the delayed internal column control pulse is generated.

11. The semiconductor device of claim 9, wherein the column address generation circuit latches the pre-column address when the delayed column control pulse is generated and inverts a logic level of the column address based on the latched pre-column address when the delayed internal column control pulse is generated.

12. A semiconductor device comprising
a column delay circuit configured to delay a column control pulse by a first column delay period to generate a delayed column control pulse;
an internal column delay circuit configured to delay an internal column control pulse by a second column delay period to generate a delayed internal column control pulse; and
a column address generation circuit configured to generate a column address from a pre-column address based on the delayed column control pulse and the delayed internal column control pulse,
wherein the pre-column address is generated by latching an address based on the column control pulse and the delayed column control pulse.

13. The semiconductor device of claim 12, wherein in a mode for which a column operation of a first bank and a column operation of a second bank are sequentially performed, the first column delay period is set as a period from a time when the column control pulse is created until a time when the column operation of the first bank starts.

14. The semiconductor device of claim 12, wherein in a mode for which a column operation of a first bank and a column operation of a second bank are sequentially performed, the second column delay period is set as a period from a time when the internal column control pulse is created until a time when the column operation of the second bank starts.

15. The semiconductor device of claim 12, wherein in a mode for which a column operation of a first bank and a column operation of a second bank are sequentially performed, a logic level combination of the column address changes from a first logic level combination for accessing the first bank into a second logic level combination for accessing the second bank.

16. The semiconductor device of claim 12, wherein the column control pulse is generated when a read operation is performed, and wherein the internal column control pulse is generated by delaying the column control pulse by a column operation period.

17. The semiconductor device of claim 16, wherein the column operation period is set as a period in which a column operation of a first bank is performed in a mode for which the column operation of the first bank and a column operation of a second bank are sequentially performed.

18. The semiconductor device of claim 12, wherein the column address generation circuit comprises an address input latch circuit configured to generate the column address from the pre-column address or a feedback address based on the delayed column control pulse and the delayed internal column control pulse.

19. The semiconductor device of claim 18, wherein the address input latch circuit buffers the pre-column address or the feedback address to generate the column address when the delayed column control pulse or the delayed internal column control pulse is generated.

20. The semiconductor device of claim 18, wherein the column address generation circuit latches the pre-column address when the delayed column control pulse is generated and inverts a logic level of the column address based on the latched pre-column address when the delayed internal column control pulse is generated.

* * * * *